United States Patent [19]

Yang et al.

[11] Patent Number: 4,894,414

[45] Date of Patent: Jan. 16, 1990

[54] RUBBER-MODIFIED CYANATE ESTER RESINS AND POLYTRIAZINES DERIVED THEREFROM

[75] Inventors: Philip C. Yang, Midland; Dale M. Pickelman, Auburn, both of Mich.

[73] Assignee: The Dow Chemical Company, Midland, Mich.

[21] Appl. No.: 79,378

[22] Filed: Jul. 30, 1987

[51] Int. Cl.$^4$ ............................................. C08L 67/06
[52] U.S. Cl. ......................................... 525/66; 525/64
[58] Field of Search ........................................... 525/66

[56] References Cited

U.S. PATENT DOCUMENTS

| | | | |
|---|---|---|---|
| 4,250,271 | 2/1981 | Morris et al. | 525/66 |
| 4,396,745 | 8/1983 | Ikeguchi | 525/374 |
| 4,403,073 | 9/1983 | Ikeguchi | 525/374 |
| 4,404,330 | 9/1983 | Ikeguchi | 525/374 |
| 4,503,186 | 3/1985 | Sugio et al. | 525/63 |
| 4,717,609 | 1/1988 | Gaku et al. | 525/64 |

FOREIGN PATENT DOCUMENTS

| | | |
|---|---|---|
| 3117902 | 2/1982 | Fed. Rep. of Germany . |
| 56-141310 | 11/1981 | Japan . |
| 56-148547 | 11/1981 | Japan . |
| 56-147452 | 12/1981 | Japan . |
| 56-157424 | 12/1981 | Japan . |
| 56-157425 | 12/1981 | Japan . |
| 56-157454 | 12/1981 | Japan . |
| 57-3817 | 1/1982 | Japan . |
| 57-174346 | 10/1982 | Japan . |
| 57-177051 | 10/1982 | Japan . |
| 57-197892 | 10/1982 | Japan . |

Primary Examiner—John C. Bleutge
Assistant Examiner—A. Carrillo

[57] ABSTRACT

Polytriazines exhibiting improved toughness without sacrificing heat resistance are prepared by curing a cyanate ester resin having dispersed therein resin-insoluble rubber particles grafted with a resin-soluble polymer. The resin-soluble polymer stabilizes the rubber particles and maintains the particles in an essentially discrete, nonagglomerated form.

46 Claims, No Drawings

4,894,414

RUBBER-MODIFIED CYANATE ESTER RESINS AND POLYTRIAZINES DERIVED THEREFROM

BACKGROUND OF THE INVENTION

This invention relates to rubber-modified cyanate ester resins and polytriazines prepared therefrom. It also relates to a process for preparing the rubber-modified cyanate ester resins and polytriazines.

Polytriazines are well-known thermosets. They possess good heat resistance, hardness, electrical properties, dimensional stability, corrosion resistance, and chemical resistance. Polytriazines are useful as adhesives and as coatings for substrates. They are also useful for the preparation of advanced composites and for the preparation of electrical laminates.

Attempts have been made to toughen or reinforce polytriazines for demanding electronic and aerospace applications by incorporating liquid or elastic rubbers, such as polybutadiene and carboxyl-terminated butadiene-acrylonitrile copolymers, into cyanate ester resins before cure. See, for example, U.S. Pat. Nos. 4,403,073; 4,404,330; 4,396,745; and 4,503,186. The liquid or elastic rubber is mixed with a cyanate ester resin or the prepolymer of the resin and the resulting mixture is cured to form the rubber-modified polytriazine.

Unfortunately, the liquid or elastic rubber is soluble in the cyanate ester resin. The formation of discrete rubber particles in the polytriazine will therefore depend on the degree of solubility of the rubber in the polytriazine. If the rubber is highly soluble, then discrete rubber particles will not form and the heat resistance of the rubber-modified polytriazine as measured by the glass transition temperature will be severely reduced because the rubber plasticizes the polytriazine. If the rubber is only partially soluble, then discrete rubber particles may form but the particle size, particle size distribution and particle composition will be uncontrollable. The heat resistance of the rubber-modified polytriazine will be reduced because of the presence of partially dissolved rubber in the polytriazine matrix. Additionally, the heat resistance and other important properties of the polytriazine will vary with the morphology of the rubber incorporated into the polytriazine.

In view of the unsuccessful attempts at preparing rubber-modified polytriazines without significantly sacrificing heat resistance, and in view of the unsuccessful attempts at controlling the morphology of the rubber incorporated into the polytriazine, it would be desirable to prepare a rubber-modified polytriazine exhibiting acceptable heat resistance and a controlled morphology. It would also be desirable to prepare a rubber-modified cyanate ester resin that could be cured to form the desired rubber-modified polytriazine.

SUMMARY OF THE INVENTION

In one aspect, the present invention is a method of preparing a rubber-modified cyanate ester resin. The method comprises the steps of (a) emulsifying at least one emulsion polymerizable monomer in an aqueous colloidal dispersion of discrete resin-insoluble rubber particles maintained in a reasonably stable state with a surfactant or emulsifier, (b) polymerizing the resulting emulsion to form a stable colloidal dispersion of resin-insoluble rubber particles wherein essentially every rubber particle is grafted with one or more resin-soluble polymer molecules resulting from the polymerization such that substantially all of the rubber particles are maintained in a discrete spaced apart relationship to each other by the resin-soluble polymer, and (c) mixing the grafted rubber particles with the cyanate ester resin to a degree sufficient to achieve a homogeneous dispersion.

The invention is also a rubber-modified cyanate ester resin. The cyanate ester resin comprises a resin continuous phase, and a discontinuous phase of a stable colloidal dispersion of resin-insoluble rubber particles wherein essentially every rubber particle is grafted with one or more resin-soluble polymer molecules such that substantially all of the rubber particles are maintained in a discrete spaced apart relationship to each other by the resin-soluble polymer.

In another aspect, the invention is a rubber-modified polytriazine of a cyanate ester resin. The polytriazine comprises a polytriazine continuous phase, and a discontinuous phase of a stable colloidal dispersion of resin-insoluble rubber particles wherein essentially every rubber particle is grafted with one or more resin-soluble polymer molecules such that substantially all of the rubber particles are maintained in a discrete spaced apart relationship to each other by the resin-soluble polymer.

Surprisingly, the rubber-modified polytriazines of this invention exhibit a substantial increase in toughness with little or no decrease in heat resistance. They can be prepared by curing the rubber-modified cyanate ester resins of this invention. The rubber particles are stabilized by the grafted polymer formed during the polymerization so that the particles remain in an essentially discrete, nonagglomerated form. The rubber particles are uniformly dispersed in the resin and the polytriazine prepared therefrom. The average rubber particle size, the distribution of particle sizes, the particle composition and the degree to which the particles are uniformly dispersed can be carefully controlled.

The rubber-modified polytriazines of this invention are useful for preparing advanced composites for aerospace structures and for preparing fiber-reinforced laminates, and for any other application where polytriazines are used.

DETAILED DESCRIPTION OF THE INVENTION

As the term is used herein, a cyanate ester resin is a monomer having at least one cyanate group. These monomers are well known in the art and are disclosed in U.S. Pat. Nos. 3,553,244; 3,740,348; and 3,755,402. Preferred cyanate ester resins are difunctional and polyfunctional aromatic polycyanates, which are disclosed in the patents referenced above and additionally in U.S. Pat. Nos. 3,448,079; 4,094,852; and 4,528,366. The preferred aromatic polycyanates are prepared from the polyhydric phenols of bisphenol A, bisphenol S, halogenated and alkylated analogs of bisphenol A and bisphenol S, novolak resins, and polyphenols bridged by at least one polycyclic aliphatic group as described in U.S. Pat. No. 4,528,366. The most preferred cyanate ester resin has the following formula:

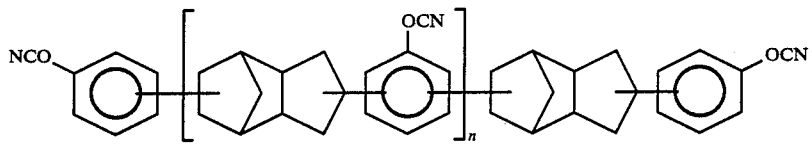

wherein the average value of n is about 0.2.

A process for preparing the most preferred cyanate ester resin and other preferred cyanate ester resins is disclosed in copending U.S. application Ser. No. 552,515, filed Nov. 16, 1983, now U.S. Pat. No. 4,748,272.

A polytriazine is the polymer formed by the trimerization of a cyanate ester resin. Included within the term are oligomers and prepolymers. Also included are copolymers of the cyanate ester resin and a monomer having at least one cyanate-reactive functionality. Examples of monomers with cyanate-reactive functionalities include but are not limited to epoxies, maleimides, and vinyl-terminated monomers.

The rubber particles of this invention have diameters of about 300 Å to about 20,000 Å, more preferably from about 900 Å to about 2,000 Å. The particles form a colloidal dispersion in water if they are treated with a surfactant or emulsifier and tend to agglomerate if they are untreated.

If desired, a bimodal distribution of rubber particles can be employed. A bimodal distribution is a distribution of large and small particles. This distribution is possible by agglomerating small particles or selectively growing small particles. In preferred embodiments, a bimodal distribution of grafted rubber particles dispersed in a cyanate ester resin exhibits a reduced viscosity relative to the viscosity exhibited by a uniform, or monodisperse, distribution of grafted rubber particles dispersed in the resin. The small particles have diameters of about 900 Å to about 1500 Å, more preferably about 1000 Å, and the large particles have diameters of about 4000 Å to about 10,000 Å, more preferably about 8000 Å.

The rubber particles are insoluble in (1) water, (2) the cyanate ester resin, and (3) any solvent for the cyanate ester resin. Examples of insoluble rubber particles are polyalkylenes, such as polyethylene; and polymers from alkyl esters of $\alpha,\beta$-ethylenically unsaturated monomers wherein the alkyl group has at least 4 carbon atoms, such as polybutyl acrylate or methacrylate, and poly(2-ethyl-1-hexyl)acrylate or methacrylate.

In a preferred embodiment, rubber particles are crosslinked to render them insoluble. Crosslinked rubber particles form a gel and swell in the cyanate ester resin, but do not dissolve. The percent gel can range from about 50 to about 98 percent of the weight of the particles, more preferably from about 70 to about 95 percent, and the swelling index can range from about 3 to about 50, more preferably from about 10 to about 30. A method for determining the percent gel and swelling index is disclosed in U.S. Pat. No. 4,146,589. Examples of rubbers that can be crosslinked to render them insoluble include polybutadiene, styrene-butadiene copolymer, acrylate rubbers, neoprene, butyl rubber, nitrile rubber, acrylonitrile-butadiene-styrene (ABS) terpolymer, polyisoprene, ethylene-propylene copolymer (EPDM), fluoroelastomers, and mixtures of the above. Preferred rubber particles are crosslinked ABS terpolymer as described in the *Encyclopedia of Polymer Sciences and Engineering*, Vol. 2, 2nd ed., pp. 388–426 (1985), and crosslinked styrene-butadiene copolymer wherein the amount of butadiene in the copolymer ranges from about 50 to about 99 percent of the weight of the particles, more preferably from about 85 to about 95 percent.

The emulsion polymerizable monomers of this invention polymerize under emulsion polymerization conditions. The polymer formed is insoluble in water and must be soluble in the cyanate ester resin, otherwise, uncontrolled agglomeration of the rubber particles can occur. Examples of suitable emulsion polymerizable monomers include vinyl aromatic monomers, such as styrene, vinyl toluene, and t-butyl styrene; $\alpha,\beta$-ethylenically unsaturated acids such as acrylic and methacrylic acid, and itaconic acid; alkyl esters of $\alpha,\beta$-ethylenically unsaturated acids wherein the alkyl group has less than 4 carbon atoms, such as methyl acrylate and methacrylate, and ethyl acrylate; hydroxyalkyl esters of $\alpha,\beta$-ethylenically unsaturated acids such as hydroxyethyl acrylate and methacrylate, and hydroxypropyl acrylate; unsaturated nitriles such as acrylonitrile; epoxy functional monomers such as glycidyl acrylate and methacrylate; and unsaturated esters of $\alpha,\beta$-ethylenically unsaturated acids such as allyl acrylate and methacrylate, and dicyclopentadiene acrylate and methacrylate; and mixtures of the above. Preferred monomer recipes are those containing mixtures of styrene, methyl methacrylate, and acrylonitrile. The most preferred monomer recipe further contains either allyl acrylate or dicyclopentadiene acrylate.

The aqueous colloidal dispersion of discrete rubber particles maintained in a reasonably stable state with a surfactant or emulsifier is commonly referred to as a rubber latex. The preparation of rubber latexes is well known in the art and is disclosed, for example, in *The Vanderbilt Rubber Handbook*, Vanderbilt Co. Inc., (1978). For a good discussion of suitable surfactants and emulsifiers, see the paragraph bridging columns 3 and 4 of U.S. Pat. No. 4,421,660.

The emulsion polymerizable monomer and the rubber latex can be combined and emulsified by normal mixing procedures, for example, by passing both the monomer and the latex through a high shear mixing device such as a Waring blender, homogenizer, or ultrasonic mixer. Preferably, the monomer is added continuously to the rubber latex during the polymerization while the rubber latex is being stirred. The continuous monomer stream can be an aqueous emulsion of the monomer where the emulsion is maintained by a surfactant or emulsifier. As another alternative, the aqueous emulsion of rubber particles and monomer can be prepared by adding rubber particles to an aqueous emulsion of monomer. In such instances, it is desirable to add more surfactant or emulsifier prior to or during the addition of the rubber particles.

The amount of rubber particles in the emulsion desirably ranges from about 15 to about 65 percent of the weight of the emulsion, more preferably from about 20 to about 50 percent, and most preferably from about 30 to about 45 percent. The monomer is present in an amount sufficient to graft onto essentially every rubber particle when the monomer is polymerized. This amoung can range from about 5 to about 50 percent of the weight of the rubber particles, more preferably from about 10 to about 30 percent. The surfactant or emulsifier is present in an amount sufficient to stabilize the aqueous dispersion of rubber particles. This amount can range from about 2 to about 5 percent of the weight of the rubber particles, more preferably from about 2 to about 3 percent. The remaining aqueous phase, which comprises water, initiator, and other additives, must be present in an amount sufficient to be the continuous phase of the emulsion.

The emulsion polymerization conditions of this invention are generally conventional free-radical type polymerizations carried out in the presence of a radical initiator such as a peroxygen compound, an azo compound, ultraviolet light and the like. Preferably, the polymerization is carried out in the presence of a water-soluble peroxygen compound at temperatures in the range from about 50° to about 90° C. The amount of free-radical initiator can range from about 0.005 to about 8 percent of the weight of the monomer, preferably from about 0.01 to about 5 percent. Examples of suitable initiators include inorganic persulfate compounds such as sodium persulfate, potassium persulfate, ammonium persulfate; peroxides such as hydrogen peroxide, t-butyl hydroperoxide, dibenzoyl peroxide and dilauroyl peroxide; azo compounds such as azobis(isobutyronitrile), and other common free-radical generating compounds. Also suitable are various forms of free-radical generating radiation means such as ultraviolet radiation, electron beam radiation and gamma radiation. Alternatively, a redox initiator composition can be employed wherein the polymerization temperature ranges from about 25° to about 80° C. Exemplary redox initiator compositions include a peroxygen compound as described hereinbefore, preferably potassium persulfate or t-butyl hydroperoxide, and a reducing component such as sodium metabisulfite or sodium formaldehyde hydrosulfite.

Chain transfer agents can be employed to control the molecular weight of the graft polymer prepared during the polymerization. Examples include mercaptans such as dodecyl mercaptan, dialkyl xanthogen disulfides, diaryl disulfides, and others listed in Blackley, *Emulsion Polymerization*, Wiley and Sons, Chapter 8 (1975), in amounts as described therein. The weight average molecular weight of the graft polymer can vary and generally ranges from about 10,000 to about 250,000, more preferably from about 20,000 to about 100,000, as measured by gel permeation chromatography.

Following polymerization, the grafted rubber particles are mixed with the cyanate ester resin to form a homogeneous dispersion of the particles in the resin. The grafted rubber particles can be dispersed in either liquid resins or solid resins after the resin is melted or placed in solution. For example, if the resin is a liquid, then an aqueous dispersion of grafted rubber particles can be mixed with the resin and the aqueous phase can then be removed. If the resin is a solid, then an aqueous dispersion of grafted rubber particles can be mixed with a resin dissolved in an organic solvent and both the aqueous and organic phases can then be removed. Alternatively, the grafted rubber particles can be extracted from the aqueous phase with an organic solvent of the cyanate ester resin and then the dispersion of grafted rubber particles can be mixed with the solid resin. If desired, a dried rubber concentrate can be mixed with the cyanate ester resin. Preferably, in such instances the mixing is accomplished using a high shear mixing device.

The amount of grafted rubber particles incorporated into the cyanate ester resin is an amount effective to provide the desired degree of toughening for the polytriazine. Generally, this amount ranges from about 0.1 to about 30 percent of the weight of the cyanate ester resin. Amounts below 0.1 percent will not provide an appreciable increase in toughness and amounts above 30 percent could adversely affect the stiffness or rigidity of the polytriazine. Amounts ranging from about 2.5 to about 10 percent are preferred.

Additives that improve the physical and chemical properties of the polytriazine can be incorporated into the cyanate ester resin in minor amounts before cure. For example, antioxidants can be added to improve the thermal stability of the grafted rubber and polytriazine.

The homogeneous dispersion of grafted rubber particles and cyanate ester resin are cured to form the rubber-modified polytriazine. The dispersion is cured in a manner similar to the curing of a cyanate ester resin that does not contain a dispersion of grafted rubber particles. The dispersion can be cured thermally without the use of a catalyst. Preferably, a catalyst is used. U.S. Pat. Nos. 3,694,410; 4,094,852; and 4,528,366 disclose suitable catalysts. Preferred catalysts are cobalt catalysts such as cobalt acetylacetonate, cobalt octoate, and cobalt naphthenate. The amount of catalyst can range from about 10 ppm to about 1000 ppm based on the weight of cyanate ester resin.

The rubber-modified polytriazines of this invention exhibit dramatically improved toughness without a significant reduction in heat resistance. This improvement is possible because the rubber particles are grafted with a polymer that maintains the particles in a discrete, spaced apart relationship to each other when the particles are incorporated into the cyanate ester resin and cured. The particles have a uniform particle size and are uniformly distributed. This ideal morphology allows the particles to substantially increase the toughness without sacrificing the heat resistance of the polytriazine.

The following example is illustrative and does not limit the scope of this invention.

EXAMPLE

In each of a series of runs, 1014 grams (g) of a rubber latex containing 300 g of rubber particles are charged into a two-liter, 3-neck, roundbottom glass flask equipped with a mechanical stirrer, temperature controller, and reflux condensor with a nitrogen inlet. The rubber particles are crosslinked styrene-butadiene copolymer (7 percent styrene, 93 percent butadiene) having an average diameter of 1100 Å as measured by a Brice Phoenix Light Scattering Unit. The particles are stabilized in the latex with 3 percent sodium dodecylbenzene sulfonate soap. 0.56 Grams of 2,2-azobis(isobutyronitrile) is added to the flask and the contents are agitated at 150 rpm. The reactor is flushed with nitrogen and is heated with the aid of a water bath to a temperature of 70° C.

For each run, about 56.3 g of a monomer stream having one of the compositions disclosed as Samples 1–6 in Table I is added to the reactor and is emulsified in the rubber latex. Twenty percent of the monomer stream is initially added continuously at 70° C. at a rate of 0.075 g per minute for 150 minutes. After this addition, the reactor temperature is raised to 80° C. and the remaining monomer stream is added continuously over a 90 minute period. The reaction mixture is heated at 80° C. for an additional 2 hours, and then is allowed to cool before being transferred to another flask. The rubber latex is vacuum stripped to remove any unreacted monomers. The resulting grafted rubber latex contains 32.3 percent solids and has an average particle diameter of 1200 Å as measured by a Brice Phoenix Light Scattering Unit.

The grafted rubber latex is diluted with methylethylketone (MEK) and water. The diluted mixture is allowed to settle and the bottom aqueous layer is removed. The top layer is washed 4 times with an aqueous solution of 25 percent MEK to remove the ionic soap and salts.

For each run, the most preferred cyanate ester resin is dissolved in the MEK dispersion of grafted rubber particles in an amount sufficient to bring the grafted rubber content to 5 percent of the total weight of the combination of the grafted rubber particles and the resin. The solvent and any remaining water are then vacuum stripped to yield a dispersion of the grafted rubber in the cyanate ester resin wherein the grafted rubber content is 5 percent of the dispersion.

A solution of cobalt acetylacetonate in acetonitrile is added to the dispersion to bring the total cobalt concentration to about 100 parts per million based on the weight of the cyanate ester resin. The resulting mixture is then cured in a mold for 1 hour at 175° C., 2 hours at 225° C. and 0.5 hours at 250° C. The resulting rubber-modified polytriazine is then machined into test specimens.

The identical procedure for preparing the rubber-modified polytriazine is repeated at least once for each run, except that the grafted rubber content of the cyanate ester resin is varied. The physical properties for each specimen are analyzed and the results are disclosed in Table II.

TABLE I

| | Composition of Monomer Stream | | | | | |
|---|---|---|---|---|---|---|
| | Weight Percent of Each Monomer Component | | | | | |
| Sample | S[1] | MMA[2] | AN[3] | GMA[4] | AA[5] | DCPDA[6] |
| 1 | 30 | 30 | 25 | 15 | — | — |
| 2 | 30 | 30 | 25 | — | 15 | — |
| 3 | 30 | 30 | 25 | — | — | 15 |
| 4 | 55 | — | 30 | — | — | 15 |
| 5 | 45 | 15 | 25 | — | — | 15 |
| 6 | 37.5 | 37.5 | 25 | — | — | — |

S = Styrene; MMA = Methyl methacrylate; AN = Acrylonitrile; GMA = Glycidyl methacrylate; AA = Allyl Acrylate; DCPDA = Dicyclopentadiene acrylate.

| Sample From Which Grafted Rubber Latex is Derived | Grafted Rubber Content of Dispersion of Modified Cyanate Ester Resin (Weight Percent) | $T_g^1$(°C.) of Rubber Modified Polytriazine | $G_{IC}^2$ (J/m²) of Rubber-Modified Polytriazine |
|---|---|---|---|
| Control* | 0 | 248 | 60 |
| 1 | 5 | 235 | 290 |
| 1 | 10 | 235 | 490 |
| 2 | 5 | 237 | 340 |
| 2 | 10 | not measured | 560 |
| 3 | 5 | 234 | 340 |
| 3 | 10 | not measured | 560 |
| 4 | 2.5 | 240 | 190 |
| 4 | 5 | 236 | 390 |
| 4 | 10 | not measured | 720 |
| 5 | 5 | not measured | 420 |
| 5 | 10 | not measured | 720 |
| 6 | 2.5 | 254 | 200 |
| 6 | 5 | 253 | 320 |
| 6 | 10 | 255 | 630 |

*Not an example of this invention
[1]$T_g$ is the glass transition temperature as measured by dynamic mechanical spectroscopy.
[2]$G_{IC}$ is the fracture energy as measured by compact tension according to ASTM procedure E-399

The data in Table II indicates a dramatic increase in the fracture energy of the rubber-modified polytriazines relative to the fracture energy of the unmodified polytriazine (control). The results shown in Table II also indicate little or no decrease in the glass transition temperature of the rubber-modified polytriazines relative to the glass transition temperature of the unmodified polytriazine.

What is claimed is:

1. A method of preparing a cyanate ester resin having incorporated therein grafted rubber particles, comprising the steps of:
   (a) emulsifying at least one emulsion polymerizable monomer in an aqueous colloidal dispersion of discrete resin-insoluble rubber particles maintained in a reasonably stable state with a surfactant or emulsifier, wherein the quantity of the emulsion polymerizable monomer is no greater than about 50 percent by weight of the resin-insoluble rubber particles,
   (b) polymerizing the resulting emulsion to form a stable colloidal dispersion of resin-insoluble rubber particles wherein essentially every rubber particle is grafted with one or more resin-soluble polymer molecules resulting from the polymerization such that substantially all of the rubber particles are maintained in a discrete spaced apart relationship to each other by the resin-soluble polymer molecules, and
   (c) mixing the grafted rubber particles with the cyanate ester resin to a degree sufficient to achieve a homogeneous dispersion.

2. The method of claim 1 further comprising the step of curing the homogeneous dispersion of the grafted rubber particles and the cyanate ester resin thereby forming a rubber-modified polytriazine.

3. The method of claim 1 wherein the cyanate ester resin is a polyfunctional aromatic polycyanate.

4. The method of claim 3 wherein the aromatic polycyanate is prepared from a polyhydric phenol selected from the group consisting of bisphenol A, bisphenol S, a halogenated or alkylated analog of bisphenol A or bisphenol S, a novolak resin, and polyphenol bridged by at least one polycyclic aliphatic group.

5. The method of claim 4 wherein the cyanate ester resin has the formula:

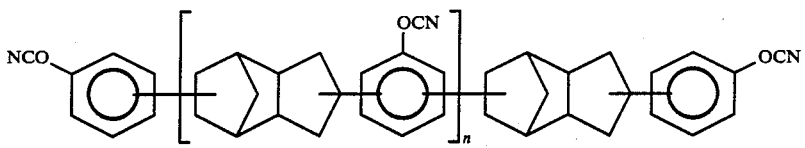

wherein the average value of n is about 0.2.

6. The method of claim 1 wherein the rubber particles have diameters of about 300 Å to about 20,0000 Å.

7. The method of claim 6 wherein the rubber particles have diameters of about 900 Å to about 2000 Å.

8. The method of claim 1 wherein the rubber particles have a bimodal distribution of small particles and large particles.

9. The method of claim 8 wherein the small particles have diameters of about 900 Å to about 15,000 Å and the large particles have diameters of about 4000 Å to about 10,000 Å.

10. The method of claim wherein the rubber particles are crosslinked to render them insoluble in the cyanate ester resin.

11. The method of claim 10 wherein the crosslinked rubber particles are selected from the group consisting of polybutadiene, styrene-butadiene copolymer, an acrylate rubber, neoprene, butyl rubber, nitrile rubber, acrylonitrile-butadiene-styrene terpolymer, polyisoprene, ethylene-propylene copolymer, a fluoroelastomer, and a mixture of the above.

12. The method of claim 11 wherein the crosslinked rubber particles are selected from the group consisting of acrylonitrile-butadiene-styrene terpolymer and styrene-butadiene copolymer wherein the amount of butadiene in the copolymer ranges from about 50 to about 99 percent of the weight of the particles.

13. The method of claim 1 wherein the emulsion polymerizable monomer is selected from the group consisting of a vinyl aromatic monomer, an $\alpha,\beta$-ethylenically unsaturated acid, an alkyl ester of an $\alpha,\beta$-ethylenically unsaturated acid wherein the alkyl group has less than 4 carbon atoms, a hydroxyalkyl ester of an $\alpha,\beta$-ethylenically unsaturated acid, an unsaturated nitrile, an epoxy functional monomer, an unsaturated ester of an $\alpha,\beta$-ethylenically unsaturated acid; and any mixture of the above.

14. The method of claim 13 wherein the emulsion polymerizable monomer is a mixture containing styrene, methylmethacrylate and acrylonitrile.

15. The method of claim 1 wherein the amount of grafted rubber particles dispersed into the cyanate ester resin ranges from about 0.1 to about 30 percent of the weight of the cyanate ester resin.

16. The method of claim 15 wherein the amount of grafted rubber particles dispersed into the cyanate ester resin ranges from about 2.5 to about 10 percent of the weight of the cyanate ester resin.

17. A cyanate ester resin having incorporated therein grafted rubber particles, comprising:

(a) a resin continuous phase, and
(b) a discontinuous phase of a stable colloidal dispersion of resin-insoluble rubber particles wherein essentially every rubber particle is grafted with one or more resin-soluble polymer molecules such that substantially all of the rubber particles are maintained in a discrete spaced apart relationship to each other by the resin-soluble polymer molecules and wherein the weight of the resin-soluble polymer is no more than about 50 percent of the weight of the resin-insoluble rubber particles.

18. The composition of claim 17 wherein the cyanate ester resin is a polyfunctional aromatic polycyanate.

19. The composition of claim 17 wherein the aromatic polycyanate is prepared from a polyhydric phenol selected from the group consisting of bisphenol A, bisphenol S, a halogenated or alkylated analog of bisphenol A or bisphenol S, a novolak resin and a polyphenol bridged by at least one polycyclic aliphatic group.

20. The composition of claim 18 wherein the cyanate ester resin has the formula:

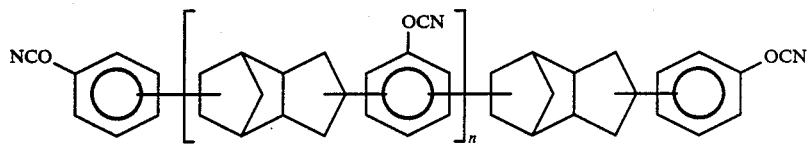

wherein the average value of n is about 0.2.

21. The composition of claim 17 wherein the rubber particles have diameters of about 300 Å to about 20,0000 Å.

22. The composition of claim 20 wherein the rubber particles have diameters of about 900 Å to about 2000 Å.

23. The composition of claim 17 wherein the rubber particles have a bimodal distribution of small particles and large particles.

24. The composition of claim 22 wherein the small particles have diameters of about 900 Å to about 15,000 Å and the large particles have diameters of about 4000 Å to about 10,000 Å.

25. The composition of claim 17 wherein the rubber particles are crosslinked to render them insoluble in the cyanate ester resin.

26. The composition of claim 25 wherein the crosslinked rubber particles are selected from the group consisting of polybutadiene, styrene-butadiene copolymer, an acrylate rubber, neoprene, butyl rubber, nitrile rubber, acrylonitrile-butadiene-styrene terpolymer, polyisoprene, ethylene-propylene copolymer, a fluoroelastomer, and a mixture of the above.

27. The composition of claim 25 wherein the crosslinked rubber particles are selected from the group consisting of acrylonitrile-butadiene-styrene terpolymer and styrene-butadiene copolymer wherein the amount of butadiene in the copolymer ranges from about 50 to about 99 percent of the weight of the particles.

28. The composition of claim 17 wherein the resin-soluble polymer is prepared from an emulsion polymerizable monomer selected from the group consisting of a vinyl aromatic monomer, an α,β-ethylenically unsaturated acid, an alkyl ester of an α,β-ethylenically unsaturated acid wherein the alkyl group has less than 4 carbon atoms, a hydroxyalkyl ester of an α,β-ethylenically unsaturated acid, an unsaturated nitrile, an epoxy functional monomer, an unsaturated ester of an α,β-ethylenically unsaturated acid; and any mixture of the above.

29. The composition of claim 27 wherein the emulsion polymerizable monomer is a mixture containing styrene, methylmethacrylate and acrylonitrile.

30. The composition of claim 17 wherein the amount of grafted rubber particles dispersed into the cyanate ester resin ranges from about 0.1 to about 30 percent of the weight of the cyanate ester resin.

31. A polytriazine of a cyanate ester resin having incorporated therein grafted rubber particles, comprising:
 (a) a polytriazine continuous phase, and
 (b) a discontinuous phase of a stable colloidal dispersion of resin-insoluble rubber particles wherein essentially every rubber particle is grafted with one or more resin-soluble polymer molecules such that substantially all of the rubber particles are maintained in a discrete spaced apart relationship to each other by the resin-soluble polymer molecules and wherein the weight of the resin-soluble polymer is no more than about 50 percent of the weight of the resin-insoluble rubber particles.

32. The composition of claim 31 wherein the polytriazine is a copolymer of the cyanate ester resin and a monomer having at least one cyanate-reactive functionality.

33. The composition of claim 31 wherein the cyanate ester resin is a polyfunctional aromatic polycyanate.

34. The composition of claim 33 wherein the aromatic polycyanate is prepared from a polyhydric phenol selected from the group consisting of bisphenol A, bisphenol S, a halogenated or alkylated analog of bisphenol A or bisphenol S, a novolak resin, and a polyphenol bridged by at least one polycyclic aliphatic group.

35. The composition of claim 34 wherein the cyanate ester resin has the formula:

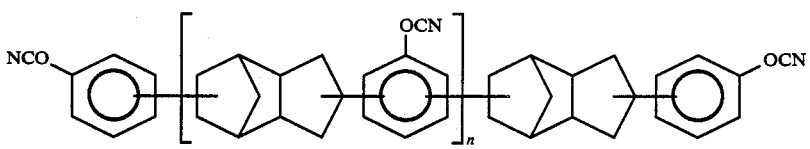

wherein the average value of n is about 0.2.

36. The composition of claim 31 wherein the rubber particles have diameters of about 300 Å to about 20,0000 Å.

37. The composition of claim 36 wherein the rubber particles have diameters of about 900 Å to about 2000 Å.

38. The composition of claim 31 wherein the rubber particles have a bimodal distribution of small particles and large particles.

39. The composition of claim 38 wherein the small particles have diameters of about 900 Å to about 15,000 Å and the large particles have diameters of about 4000 Å to about 10,000 Å.

40. The composition of claim 31 wherein the rubber particles are crosslinked to render them insoluble in the cyanate ester resin.

41. The composition of claim 40 wherein the crosslinked rubber particles are selected from the group consisting of polybutadiene, styrene-butadiene copolymer, an acrylate rubber, neoprene, butyl rubber, nitrile rubber, acrylonitrile-butadiene-styrene terpolymer, polyisoprene, ethylene-propylene copolymer, a fluoroelastomer, and a mixture of the above.

42. The composition of claim 41 wherein the crosslinked rubber particles are selected from the group consisting of acrylonitrile-butadiene-styrene terpolymer and styrene-butadiene copolymer wherein the amount of butadiene in the copolymer ranges from about 50 to about 99 percent of the weight of the particles.

43. The composition of claim 31 wherein the resin-soluble polymer is prepared from an emulsion polymerizable monomer selected from the group consisting of a vinyl aromatic monomer, an α,β-ethylenically unsaturated acid, an alkyl ester of an α,β-ethylenically unsaturated acid wherein the alkyl group has less than 4 carbon atoms, a hydroxyalkyl ester of an α,β-ethylenically unsaturated acid, an unsaturated nitrile, an epoxy functional monomer, an unsaturated ester of an α,β-ethylenically unsaturated acid; and any mixture of the above.

44. The composition of claim 43 wherein the emulsion polymerizable monomer is a mixture containing styrene, methylmethacrylate and acrylonitrile.

45. The composition of claim 31 wherein the amount of grafted rubber particles dispersed into the polytriazine ranges from about 0.1 to about 30 percent of the weight of the cyanate ester resin.

46. The composition of claim 45 wherein the amount of grafted rubber particles dispersed into the polytriazine ranges from about 2.5 to about 10 percent of the weight of the cyanate ester resin.

* * * * *

UNITED STATES PATENT AND TRADEMARK OFFICE
CERTIFICATE OF CORRECTION

PATENT NO. : 4,894,414

DATED : January 16, 1990

INVENTOR(S) : Philip C. Yang and Dale M. Pickelman

It is certified that error appears in the above-identified patent and that said Letters Patent is hereby corrected as shown below:

Column 5, line 4, the word "amoung" should correctly read --amount--.

Column 7, line 55, please identify the table with the heading --Table II--.

Column 7, line 56, Table II, please insert the sub-heading --Properties of Rubber-Modified Polytriazines--.

Column 9, line 23, Claim 10, "The method of claim wherein" should correctly read --The method of claim 1 wherein--.

Signed and Sealed this

Seventh Day of May, 1991

Attest:

HARRY F. MANBECK, JR.

*Attesting Officer*  *Commissioner of Patents and Trademarks*